United States Patent
Quinn

(10) Patent No.: US 7,994,609 B2
(45) Date of Patent: Aug. 9, 2011

(54) SHIELDING FOR INTEGRATED CAPACITORS

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 137 days.

(21) Appl. No.: 12/276,289

(22) Filed: Nov. 21, 2008

(65) Prior Publication Data

US 2010/0127347 A1    May 27, 2010

(51) Int. Cl.
    H01L 21/02    (2006.01)
(52) U.S. Cl. .......................... 257/532; 257/499; 257/528
(58) Field of Classification Search .................. 257/296, 257/306, 307, 309, 532; 361/306.1, 306.2
    See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |

(Continued)

FOREIGN PATENT DOCUMENTS

DE    25 48 563 A1    5/1977

(Continued)

OTHER PUBLICATIONS

Fukuda, H. et al. "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

(Continued)

*Primary Examiner* — Thanh V Pham
*Assistant Examiner* — Errol Fernandes
(74) *Attorney, Agent, or Firm* — Scott Hewett; John J. King

(57) ABSTRACT

A capacitor in an integrated circuit ("IC") includes a core capacitor portion having first conductive elements electrically connected to and forming a part of a first node of the capacitor formed in a first layer and second conductive elements electrically connected to and forming a part of a second node of the capacitor formed in the first layer. The first and second conductive elements alternate in the first conductive layer. Third conductive elements electrically connected to and forming a part of the first node are formed in a second layer adjacent to the first layer. The capacitor also includes a shield capacitor portion having fourth conductive elements formed in at least first, second, third, and fourth layers. The shield capacitor portion is electrically connected to and forms a part of the second node of the capacitor and surrounds the first and third conductive elements.

19 Claims, 9 Drawing Sheets

U.S. PATENT DOCUMENTS

| | | | |
|---|---|---|---|
| 5,005,103 | A | 4/1991 | Kwon et al. |
| 5,021,920 | A | 6/1991 | Smith |
| 5,077,225 | A | 12/1991 | Lee |
| 5,083,184 | A | 1/1992 | Eguchi |
| 5,089,878 | A | 2/1992 | Lee |
| 5,117,114 | A | 5/1992 | Street et al. |
| 5,119,169 | A | 6/1992 | Kozono et al. |
| 5,142,639 | A | 8/1992 | Kohyama et al. |
| 5,155,658 | A | 10/1992 | Inam et al. |
| 5,166,858 | A | 11/1992 | Frake et al. |
| 5,172,299 | A | 12/1992 | Yamada et al. |
| 5,177,410 | A | 1/1993 | Hashiguchi et al. |
| 5,189,594 | A | 2/1993 | Hoshiba |
| 5,208,725 | A | 5/1993 | Akcasu |
| 5,275,974 | A | 1/1994 | Ellul et al. |
| 5,583,359 | A | 12/1996 | Ng et al. |
| 5,712,813 | A | 1/1998 | Zhang |
| 5,868,388 | A | 2/1999 | Wood et al. |
| 5,939,766 | A | 8/1999 | Stolmeijer et al. |
| 6,037,621 | A | 3/2000 | Wilson |
| 6,064,108 | A | 5/2000 | Martinez |
| 6,066,537 | A | 5/2000 | Poh |
| 6,297,524 | B1 | 10/2001 | Vathulya et al. |
| 6,303,456 | B1 | 10/2001 | Pricer et al. |
| 6,303,457 | B1 | 10/2001 | Christensen et al. |
| 6,383,858 | B1 | 5/2002 | Gupta et al. |
| 6,385,033 | B1 | 5/2002 | Javanifard et al. |
| 6,410,954 | B1 | 6/2002 | Sowlati et al. |
| 6,417,556 | B1 | 7/2002 | Long et al. |
| 6,542,351 | B1 | 4/2003 | Kwang |
| 6,570,210 | B1 | 5/2003 | Sowlati et al. |
| 6,597,562 | B1 | 7/2003 | Hu et al. |
| 6,625,006 | B1 | 9/2003 | Aram et al. |
| 6,653,681 | B2 | 11/2003 | Appel |
| 6,661,079 | B1 | 12/2003 | Bikulcius |
| 6,690,570 | B2 * | 2/2004 | Hajimiri et al. ............ 361/306.1 |
| 6,737,698 | B1 | 5/2004 | Paul et al. |
| 6,747,307 | B1 | 6/2004 | Vathulya et al. |
| 6,765,778 | B1 | 7/2004 | Du et al. |
| 6,819,542 | B2 | 11/2004 | Tsai et al. |
| 6,822,312 | B2 | 11/2004 | Sowlati et al. |
| 6,880,134 | B2 | 4/2005 | Drennan |
| 6,882,015 | B2 | 4/2005 | Bernstein et al. |
| 6,897,505 | B2 | 5/2005 | Aton |
| 6,903,918 | B1 | 6/2005 | Brennan |
| 6,927,125 | B2 | 8/2005 | Jones et al. |
| 6,933,551 | B1 * | 8/2005 | Stribley et al. ................. 257/296 |
| 6,949,781 | B2 | 9/2005 | Chang et al. |
| 6,963,122 | B1 | 11/2005 | Soenen et al. |
| 6,974,744 | B1 | 12/2005 | Aram et al. |
| 7,009,832 | B1 | 3/2006 | Chen et al. |
| 7,013,436 | B1 | 3/2006 | Morton et al. |
| 7,027,287 | B2 | 4/2006 | Georgakos |
| 7,038,296 | B2 | 5/2006 | Laws |
| 7,050,290 | B2 | 5/2006 | Tang et al. |
| 7,116,544 | B1 | 10/2006 | Sutardja |
| 7,154,734 | B2 | 12/2006 | Schultz et al. |
| 7,161,228 | B1 | 1/2007 | Pettit |
| 7,170,178 | B1 | 1/2007 | Bely et al. |
| 7,193,263 | B2 | 3/2007 | Barth |
| 7,195,971 | B2 | 3/2007 | Bernstein et al. |
| 7,202,548 | B2 | 4/2007 | Lee |
| 7,259,956 | B2 * | 8/2007 | Fong et al. ................. 361/306.2 |
| 7,271,465 | B2 | 9/2007 | Jessie et al. |
| 7,274,085 | B1 | 9/2007 | Hsu et al. |
| 7,298,001 | B1 | 11/2007 | Liu |
| 7,348,624 | B2 | 3/2008 | Sakaguchi et al. |
| 7,439,570 | B2 * | 10/2008 | Anthony ........................ 257/309 |
| 7,485,914 | B2 | 2/2009 | Huang et al. |
| 7,564,675 | B2 | 7/2009 | Chen et al. |
| 7,663,233 | B2 | 2/2010 | Lim |
| 7,768,054 | B2 | 8/2010 | Benetik |
| 2005/0077581 | A1 | 4/2005 | Chang et al. |
| 2005/0135042 | A1 | 6/2005 | Chiu-Kit Fong et al. |
| 2005/0161725 | A1 | 7/2005 | Da Dalt |
| 2006/0203424 | A1 | 9/2006 | Chen et al. |
| 2007/0181973 | A1 | 8/2007 | Hung et al. |
| 2007/0190760 | A1 | 8/2007 | Coolbaugh et al. |
| 2007/0278551 | A1 | 12/2007 | Anthony |
| 2007/0296013 | A1 | 12/2007 | Chang et al. |
| 2009/0057826 | A1 | 3/2009 | Kim et al. |

FOREIGN PATENT DOCUMENTS

| | | |
|---|---|---|
| DE | 100 46 910 A1 | 10/2001 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Amintoosi et al., "Using pattern matching for tiling and packing problems" European Journal of Operational Research, Amsterdam, NL, vol. 83, No. 3, Jul. 10, 2007, pp. 950-960.

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

U.S. Appl. No. 12/276,291, filed Nov. 21, 2008, Quinn, Patrick J., Xilinx, Inc. 2100 Logic Drive, San Jose, California.

U.S. Appl. No. 12/276,292, filed Nov. 21, 2008, Quinn, Patrick J., Xilinx, Inc. 2100 Logic Drive, San Jose, California.

U.S. Appl. No. 12/276,293, filed Nov. 21, 2008, Quinn, Patrick J., Xilinx, Inc. 2100 Logic Drive, San Jose, California.

U.S. Appl. No. 12/276,296, filed Nov. 21, 2008, Quinn, Patrick J., Xilinx, Inc. 2100 Logic Drive, San Jose, California.

U.S. Appl. No. 12/276,280, filed Nov. 21, 2008, Quinn, Patrick J., Xilinx, Inc. 2100 Logic Drive, San Jose, California.

Aparicio and Hajimiri, "Capacity Limits and Matching Properties of Integrated Capacitors", IEEE J. Solid-State circuits, vol. 37, No. 3, pp. 384-393, Mar. 2002.

Samavati, H. et al., "Fractal Capacitor", IEEE Journal of Solid-State Circuit, vol. 33, No. 12 pp., 2035-2041, Dec. 1998.

Chan et al., "Analysis of MMIC Structures Using an Efficient Iterative Approach", IEEE Transactions on Microwave Theory and Techniques, vol. 36, No. 1, Jan. 1988, pp. 96-105.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Rajagopalan et al., "Optimization of Metal-Metal Comb-Capacitors for RF Applications", Wireless Design & Development, Mar. 4, 2001, pp. 1-4.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

* cited by examiner

SHIELDING FOR INTEGRATED CAPACITORS

RELATED APPLICATIONS

This patent application is being concurrently filed with commonly owned U.S. Patent Application entitled INTEGRATED CAPACITOR WITH TARTAN CROSS SECTION by Patrick J. Quinn; and with commonly owned U.S. Patent Application entitled INTEGRATED CAPACITOR WITH INTERLINKED LATERAL FINS by Patrick J. Quinn; and with commonly owned U.S. Patent Application entitled INTEGRATED CAPACITOR WITH CABLED PLATES by Patrick J. Quinn; and with commonly owned U.S. Patent Application entitled INTEGRATED CAPACITOR WITH ARRAY OF CROSSES by Patrick J. Quinn; and with commonly owned U.S. Patent Application entitled INTEGRATED CAPACITOR WITH ALTERNATING LAYERED SEGMENTS by Jan L. de Jong et al., the disclosures of which are each hereby incorporated by reference in their entireties for all purposes.

FIELD OF THE INVENTION

The present invention relates to capacitors formed in integrated circuits ("ICs") commonly referred to as integrated capacitors.

BACKGROUND

Methods of fabricating ICs typically include a front-end sequence of processing, in which various electrical devices such as transistors are formed in a semiconductor substrate, and a back-end sequence of processing, generally including forming alternating layers of dielectric material and patterned conductive material (typically metal) with conductive vias or other techniques being used to interconnect the metal layers to form a three-dimensional wiring structure that connects electrical devices to other electrical devices and to terminals of the IC.

Capacitors are used in IC systems for a variety of purposes. In many instances, it is desirable to incorporate (integrate) a capacitor in the IC chip. A simple approach is to form two conductive plates with an intervening dielectric; however, this consumes a relatively large area for the capacitance obtained. One technique for increasing the capacitance of a given area is to use multiple conductive plates, each conductive plate separated from the proximate plate(s) by dielectric. Further techniques use conducting strips, also called conductive lines, conductive fingers, or conductive traces, that are alternately connected to the first and second capacitor terminals (nodes). Sidewall coupling between the conductive strips provides capacitance. Layers of conducting strips, either offset or arranged in vertical congruency, can be added to further increase the capacitance of an integrated capacitor structure.

One capacitor has a number of conductive strips in successive layers connected to the first node alternating with an equal number of conductive strips connected to the second node of the integrated capacitor. The conductive strips are offset a half cell on successive layers, so that a conductive strip connected to the first node has conductive strips connected to the second node above and on both sides of it. Providing an equal number of conductive strips in a layer for each node balances the coupling of each node to the substrate, which is desirable in some applications, but undesirable in others, such as switching applications where it is desirable to have less coupling at one node. In order to reduce coupling to the substrate, a thick layer of silicon dioxide is used between the substrate and the first layer of conductive strips. This may be difficult to integrate in a standard CMOS fabrication sequence and might require additional steps to be added to the standard process flow. The overlapping parallel conductive strips are connected at their ends using buss strips that consume additional surface area.

Another approach to providing an integrated capacitor is to have conductive strips in a layer connected to alternate nodes of the capacitor with overlapping conductive strips connected to the same node. This forms essentially a curtain of conductive strips and interconnecting vias connected to the first node of the capacitor with adjacent curtains of conductive strips and interconnecting vias connected to the second node. Overlapping conductive strips connected to the same node avoids the lost surface area associated with buss strips; however, inter-layer capacitance is reduced because the upper strip is connected to the same node as the lower strip. This effect is somewhat obviated because, as critical dimensions shrink, inter-strip capacitance becomes more dominant than inter-layer capacitance. In other words, the dielectric layer separation between successive metal layers becomes increasingly greater than the dielectric separation between conductive strips with decreasing critical dimension.

Conventional integrated capacitors are often susceptible to electronic noise, which can affect the performance of the IC. In some applications, such as a filter capacitor application where one of the capacitor nodes (typically the bottom node) is connected to ground or to a power supply voltage, some degree of noise is often tolerable. However, in other applications, such as when the capacitor is used in a signal path (i.e., as a coupling capacitor or a switched capacitor), noise coupling can seriously degrade the performance of the circuit. Noise coupled onto a capacitor are particularly problematic when very low analog voltages are coupled through the capacitor, especially in a system on a chip, which often produce more electrical noise than other types of ICs, such as a memory chip. Thus, integrated capacitors providing better noise immunity are desired for used low-noise applications on an IC.

SUMMARY

A capacitor in an integrated circuit ("IC") includes a core capacitor portion having a first plurality of conductive elements electrically connected to and forming part of a first node of the capacitor formed in a first conductive layer of the IC and a second plurality of conductive elements electrically connected to and forming part of a second node of the capacitor formed in the first conductive layer. The first plurality of conductive elements alternates with the second plurality of conductive elements in the first conductive layer. A third plurality of conductive elements electrically connected to and forming part of the first node is formed in a second conductive layer adjacent to the first conductive layer, at least portions of some of the second plurality of conductive elements overlying and vertically coupling to at least portions of some of the third plurality of conductive elements. The capacitor also includes a shield capacitor portion having a fourth plurality of conductive elements formed in at least the first conductive layer of the IC, the second conductive layer of the IC, a third conductive layer of the IC, and a fourth conductive layer. The first and second conductive layers are between the third and fourth conductive layers. The shield capacitor portion is electrically connected to and forms part of the second node of the capacitor and surrounds the first and third pluralities of conductive elements.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
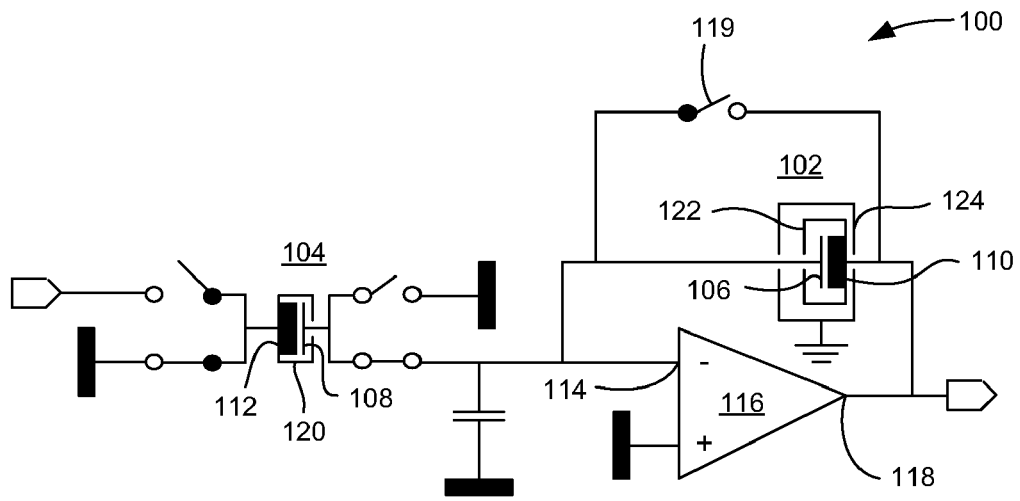
FIG. 1 is a circuit diagram of a circuit using capacitors according to embodiments of the invention.

FIG. 1 is a circuit diagram of a circuit 100 using capacitors 102, 104 according to embodiments of the invention. The top node 108 of capacitor 104 is switchable to be connected to or disconnected from a high-impedance input 114 of amplifier 116. The bottom node 112 is connected to a switch. The top node 106 of the feedback capacitor 102 is also connected to the high-impedance input 114 of the amplifier 116 while the bottom node 110 is connected to output 118 of the amplifier 116. The feedback capacitor 102 is switchably shorted by closing switch 119. The coupling capacitor 104 has a top node 108 shielded by a bottom node shield 120 that essentially surrounds the top node 108 with conductive structures electrically connected to the bottom node and reduces parasitic capacitive coupling of the top node 108 to other nodes of the circuit 100. Connection to the top node 108 is made through a gap in the bottom node shield 120. Although the bottom node shield is shown as being contiguous, in some embodiments the bottom node shield is made up of several conductive elements, such as metal filaments, metal vias, and polysilicon or silicide plates or strips, to form a conductive cage around the top node, shielding the top node from electronic noise and from coupling to other nodes of the IC. In some embodiments, the bottom node shield contributes to the overall capacitance of the integrated capacitor by coupling to the top node.

The feedback capacitor 102 has a top node 110 shielded by a bottom node shield 122, and by an optional reference shield 124. The reference shield 124 is connected to a relatively stable reference voltage present in the IC, such as analog ground, digital ground, or $V_{DD}$. The reference shield 124 essentially surrounds the bottom node shield 120 and shields the bottom node from substantially coupling to more than one voltage reference (e.g., the bottom node couples to $V_{DD}$ or ground, but not both). In other embodiments, a reference shield partially surrounds a bottom node shield. The reference shield has a gap allowing electrical contact to be made to the bottom node, as described above.

The terms "top" node and "bottom" node do not necessarily relate to the physical orientation of the nodes relative to the IC or other structure, but are used as terms of convenience. In some circuit applications, the top node of a capacitor indicates the node that is connected to a high-impedance or high-gain port of an amplifier or other device. In a system-on-chip ("SoC"), the accuracy on an analog-to-digital converter ("ADC") is dependent on the ratio of the parasitic capacitance at the top node ($C_{top}$) to all other nodes except the bottom node and the capacitance ($C_{sig}$) that is the useful floating signal capacitance between both nodes. It is desirable to shield the top plate from ground currents or voltage supply fluctuations so that $C_{top}$ remains low. Using the bottom node to essentially surround the top node isolates the top node from coupling with other nodes in the circuit by essentially forming a portion of Faraday shell around the top node, and in some embodiments, distancing the top node from other conductive elements in the IC. It is understood by those of skill in the art that electrical connection to the top node is made through the bottom node shield, and therefore the bottom node shield does not completely surround the top node.

In some embodiments, some sides of the top node are left unshielded. For example, an end of the top node that is physically distant from other nodes might be left unshielded. In other embodiments, integrated capacitors are used as design cells, and adjacent integrated capacitors are connected in parallel to obtain a higher total capacitance. In some embodiments, the portions of the bottom node shield of adjacent commonly-connected integrated capacitors are omitted, allowing higher packing density.

Complex ICs, such as programmable logic devices, often have several patterned metal layers separated by layers of dielectric material formed over a semiconductor substrate that are used for wiring connections and other functions commonly called the "backend" of the IC. Some embodiments of the invention are adaptable to existing CMOS process sequences by using masks that form the desired patterns in the appropriate metal layers and vias through the inter-metal dielectric ("IMD") layers or inter-layer dielectric ("ILD") in the backend of the IC. The vias are formed using any of several known techniques, such as contact plug, damascene, or dual damascene techniques. Similarly, the conductive strips are formed using any of several known techniques, such as thin-film metal etch, thin-film metal lift-off, damascene, and dual damascene techniques. In some embodiments, one of the conductive layers is a polysilicon or silicide layer. In a further embodiment, a conductive well in the semiconductor substrate forms a portion of a capacitor plate or a shield.

Figure 2A:
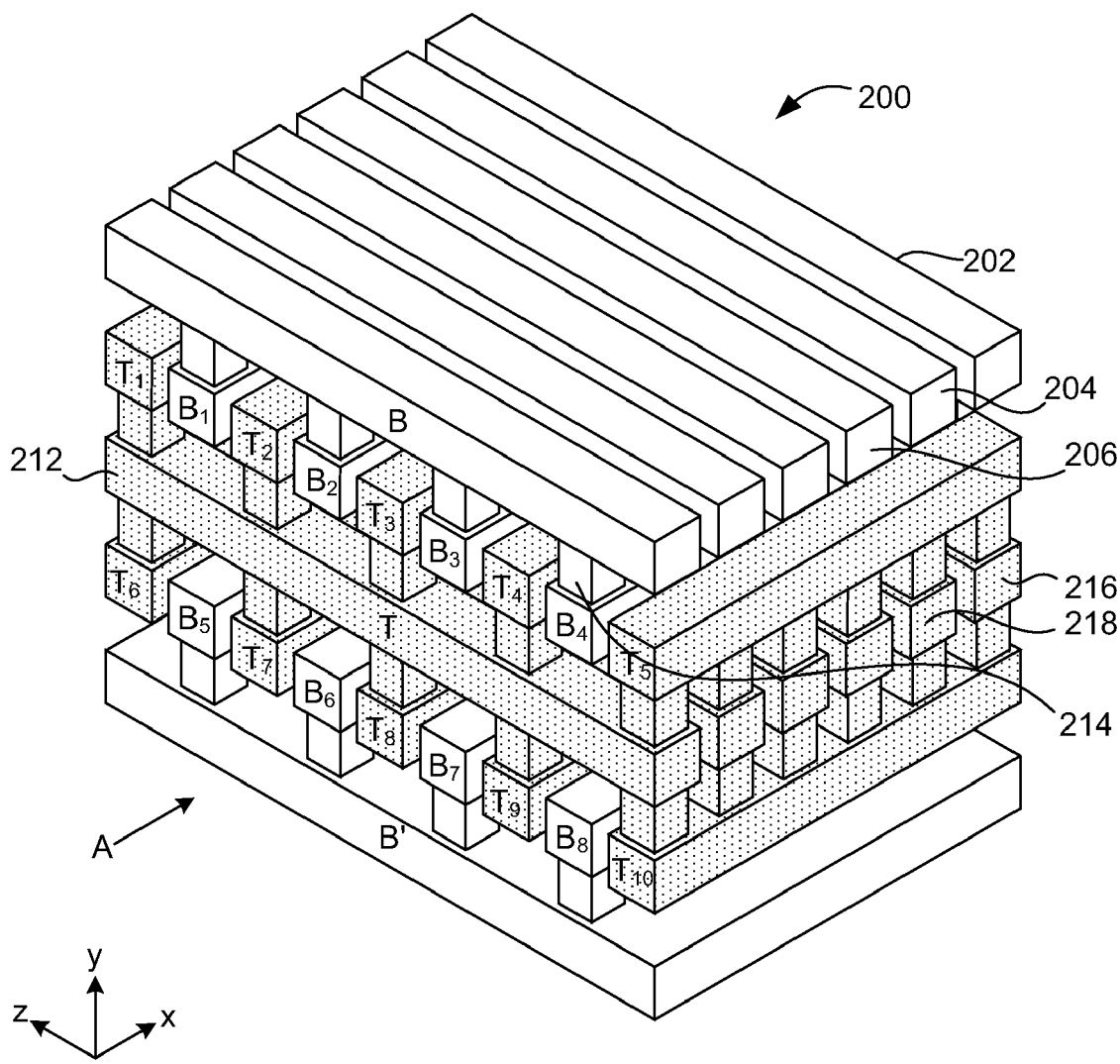
FIG. 2A is an isometric view of a portion of a shielded integrated capacitor suitable for use in embodiments of the present invention.

FIG. 2A is an isometric view of a portion 200 of an integrated capacitor according to an embodiment of the present invention. A bottom plate conductive matrix 202 includes a first bottom plate layer B made up of a first plurality of conductive strips 204, 206 and a second bottom plate layer B' made up of a sheet of polysilicon or silicide, in what is commonly called a "poly" layer, all connected to the bottom node of the integrated capacitor. The bottom node in this embodiment is the capacitor node that is less susceptible to electronic noise than the top node when the capacitor is used in a particular circuit application. A top plate conductive matrix 212 is covered by the first bottom plate layer B and underlain by the second bottom plate layer B', which forms a partial Faraday shield around the top node.

The first bottom plate layer is made up of strips, rather than a continuous sheet, because of design layout rules familiar to those of skill in the art of IC fabrication. Generally, each metal layer has minimum and maximum metal line widths and minimum separations. Polysilicon and silicide layers typically have different design and process rules than patterned metal layers, which allows forming the bottom plate layer as a contiguous sheet of poly when the poly layer is used. Similarly, large conductive areas can be formed in the semiconductor substrate (e.g., an N-well or a P-well) to form a continuous conductive sheet. In an alternative embodiment, the second bottom plate layer is formed in a conductive well of the substrate. The conductive well is separated from the poly layer by a relatively thin dielectric layer, providing good electrical performance even though the N-well is generally less conductive than a metal layer or poly layer. Using a conductive well to form part of a shield is further desirable because a moat can be formed around the portion of the substrate in which the N-well or P-well is formed, which further isolates the N- or P-well from stray currents. Use of a conductive well in a shield is also desirable because the well is surrounded in a fairly symmetrical fashion by metal, leading to symmetrical current flow through the well portion of the shield.

The conductive strips 204, 206 in the top plate layer B are electrically connected through vias (not shown, see, e.g., via 214) to transverse (i.e., generally orthogonal) conductive strips (e.g., B4) in the lower layer so that interconnection between conductive strips 204, 206 in the metal layer of the first bottom plate layer B is not necessary. Alternatively, conductive cross members (cross-connects between strips in the metal layer) are optionally included in the first bottom plate layer to connect conductive strips in the layer, which improves shielding.

Similarly, a top plate layer T is made up of a plurality of conductive strips 216, 218 connected to the top node of the integrated capacitor. The conductive strips in the top plate layer T are transverse to conductive strips T1, T2, T3, T4, T5 above the top plate layer T and transverse to conductive strips T6, T7, T8, T9, T10 below the top plate layer, and conductive strips in the top plate layer T are electrically connected to each other through vias and transverse conductive strips above and below the top plate layer T. In some embodiments, the conductive strips (e.g. T1, B1) are made from a minimum-width metal line and are commonly referred to as "conductive filaments" or "metal filaments" and provide high line densities and high lateral capacitance. Lateral capacitance between conductive strips in the plate layers does not contribute to the specific capacitance of the integrated capacitor because the metal strips are connected to the same node, and conductive strips in the plate layers are often wider than minimum metal line width.

The plate layers B, T, B' do not have alternating conductive strips, but rather all the conductive strips in these layers are connected to either the top node or the bottom node of the integrated capacitor. The configuration of a capacitor according to FIG. 2A provides bottom plates B, B' that shield the conductive elements of the top plate because they are embedded between the first and second bottom plate layers in the IC stack. Conductive curtains (see, FIG. 2B, ref. nums. 236, 238) on the right and left sides of the top plate conductive matrix are formed of vias and metal layers between the first bottom plate B and the second bottom plate B' and extend along a third direction (e.g., the Z direction as illustrated in FIG. 2A) to form essentially a conductive plane (in the plane defined by the Y and Z axes). The bottom plate conductive matrix of the integrated capacitor loosely surrounds the top plate conductive matrix of the integrated capacitor so that the top plate couples with the bottom plate on the top, bottom, right side, and left side. In a further embodiment, additional conductive curtains are optionally added in the plane defined by the X and Z axes to cover (shield) the ends of the top node conductive elements in these planes.

Figure 2B:
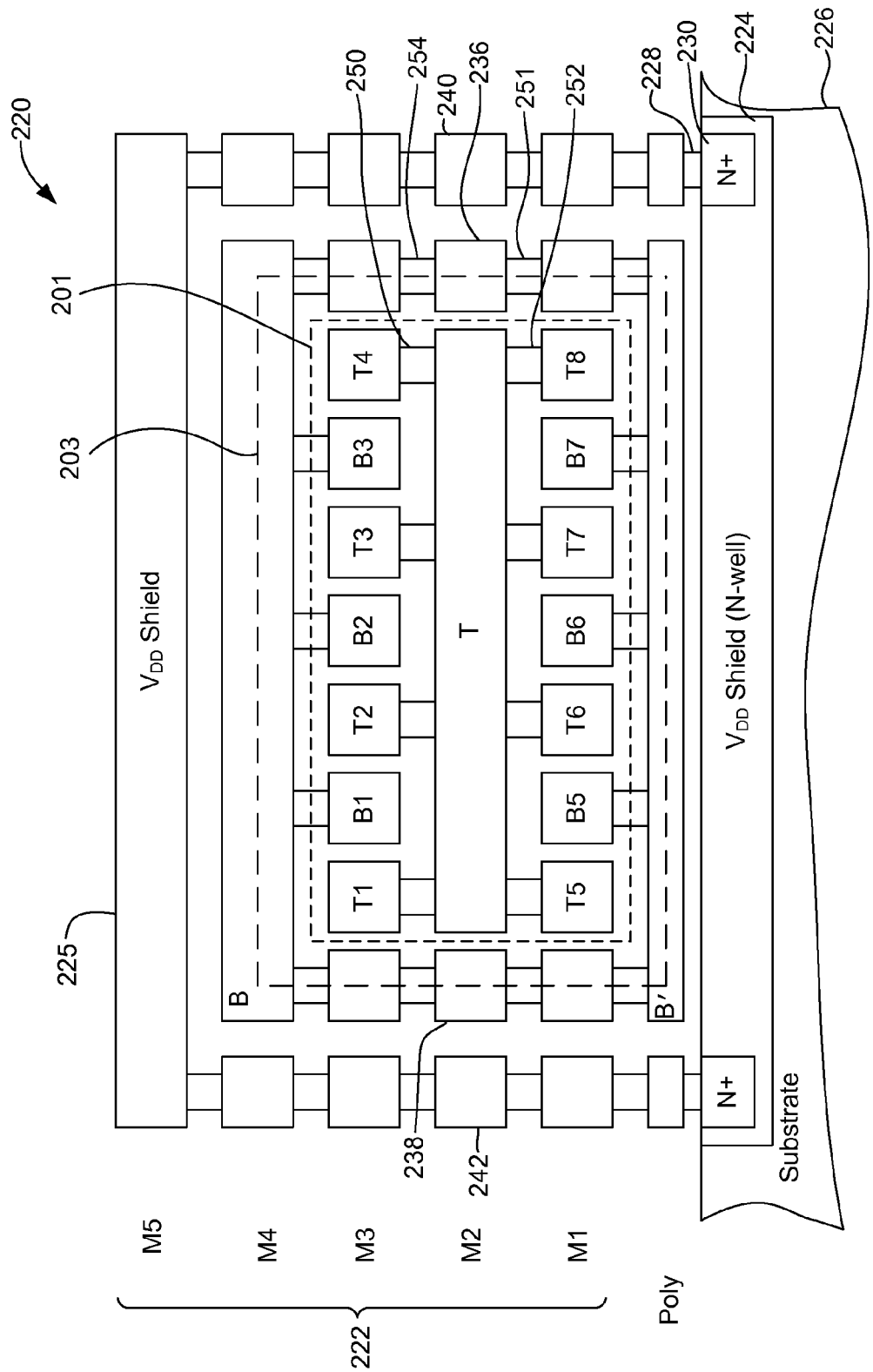
FIG. 2B is a side view of a integrated capacitor 220 in accordance with FIG. 2A.

FIG. 2B is a side view of a integrated capacitor 220 in accordance with FIG. 2A. The side view is taken along the direction of the arrow A in FIG. 2A. The integrated capacitor has a core capacitor portion 201 and a shield capacitor portion 203. The shield capacitor portion 203 is basically a bottom node shield that has a first shield layer B formed in the fifth metal layer M5 of a backend stack 222 of an IC that includes metal layers M1, M2, M3, M4, M5 and intervening dielectric layers that have vias (e.g., via 251) extending through the dielectric layers to connect metal layers. The dielectric layers are not shown with hatching for clarity of illustration, as they are well understood by those of skill in the art of IC processing.

Integrated capacitors according to alternative embodiments include additional metal layers. The integrated capacitor includes an optional reference shield, which in this embodiment is a reference shield connected to $V_{DD}$. The reference shield includes a shield plate 224 made up of a conductive well (Nwell), formed in the semiconductor substrate 226 of the IC, a top shield plate 225 formed in the M5 metal layer, and conductive curtains 240, 242.

The shield capacitor portion 203 forms a conductive sheath around the core capacitor portion 201, which has interleaved top and bottom node conductive filaments that provide high specific lateral capacitance in the M1 and M3 metal layers, and vertical capacitance between the bottom node elements in M1 and M3 and the top node elements in M2, which is adjacent to both M1 and M3. The shield capacitor portion adds additional capacitance by coupling to the top node conductive elements in M1, M2, and M3. In a typical embodiment, each layer of interleaved filaments will have hundreds of filaments and the lateral coupling between the filaments is a significant portion of the total capacitance of the integrated capacitor.

The second bottom plate layer B' is formed in the poly layer of the IC. In an alternative embodiment, the second bottom plate layer is formed as strips in a metal layer, such as M1 or M2, in a backend stack that has additional metal layers. Utilizing the poly layer for the second bottom plate layer allows a shielded integrated capacitor (without the optional $V_{DD}$ shield) to be formed in a four-metal-layer IC. In an alternative embodiment, a conductive well formed in the semiconductor substrate is used as the second bottom plate layer, allowing an embodiment to be fabricated in three metal layers of an IC, or allowing additional metal layers for increasing the specific capacitance of a capacitor of a given area. The dielectric layer above the substrate and poly layer (not separately shown) is commonly called an inter-layer dielectric ("ILD"), and the conductive element 228 connecting the poly layer to the N+ conductive area 230 of the substrate is commonly called a contact, as opposed to a via. A gate dielectric layer (not separately shown) between the poly and the N-well is typically much thinner than the ILD layer.

FIG. 2B is not drawn to scale. Generally, the thicknesses of the IMD and ILD layers are greater than the spacing between the interleaved conductive strips (e.g., T1 and B1) in the interleaved layers M3 and M1. In an exemplary embodiment, the ILD layer is about 300 nm thick silicon oxide, while the dielectric layer between the poly layer and M1 layer is about 100 nm thick and the higher layers are about 250 nm. The minimum separation between metal traces in a layer is typically much smaller, thus the sidewall capacitance between T1 and B1, for example, is greater than the vertical capacitance between T1 and B. Similarly, the sidewall capacitance between the ends of the top plate conductive matrix (e.g., T1, T4, T5, T8, and both ends of T) and the conductive curtains 236, 238; and the end vias 250, 252 and curtain vias 254, 251 (and corresponding vias on other sides) provide additional capacitance that compensates for the lack of interleaving in the M4, M2 and poly layers. As node technology shrinks and the minimum dimension between conductive strips in the interleaved layers decreases, the relative contribution of sidewall capacitance between interleaved metal strips and vias to the overall capacitance increases.

The optional reference shield includes a first shield layer 225 and the shield plate 224 formed in the N-well that are connected through a series of vias, metal, poly, and contacts. The vias, metal, poly, and contacts form a first shield curtain and a second shield curtain that are basically the right and left vertical portions of the reference shield. In a further embodiment, third and fourth conductive curtains of the bottom plate conductive matrix enclose the as-viewed front and back planes of the bottom node shield and core capacitor. These features are not shown for purposes of clarity of illustration, as they would be understood by one of ordinary skill in the art in light of the conductive and shield curtains illustrated in side view.

The reference shield is connected to a stable voltage reference, such as $V_{DD}$ or ground, to reduce coupling of the bottom node to more than one voltage node. For example, the bottom node matrix couples essentially only to the top node and to $V_{DD}$. Negligible coupling of the other nodes of the IC to the bottom node occurs. Similarly, if the shield were connected to ground instead of $V_{DD}$, the bottom node would only couple to the top node and ground.

It is generally undesirable for the bottom node to couple to $V_{DD}$ and ground simultaneously because the bottom node would then act as a bridge between ground and $V_{DD}$, and could couple undesirable switching currents between the two nodes, for example. However, in some embodiments, limited coupling to both $V_{DD}$ and ground is acceptable, particularly if coupling of the bottom node shield to a reference shield is limited to conductive elements connected to an isolated portion of the substrate, or if the ground node is an analog ground node that is reasonably well isolated from a digital ground node.

A gap or similar feature (not shown, see FIG. 1) is provided in the shield to allow circuit connection to the bottom node conductive matrix, and a second gap or similar feature is provided in the shield, and a third gap or similar feature is provided in the bottom plate conductive matrix to allow connection to the top node conductive matrix. In embodiments omitting front and back conductive curtains or shield curtains, electrical connections to the conductive matrices can be brought out in the directions orthogonal to the plane of the illustration sheet, for example. Bottom node shielding can also be brought out along the top node connection to a switch, for example, to further shield the top node.

Figure 2C:
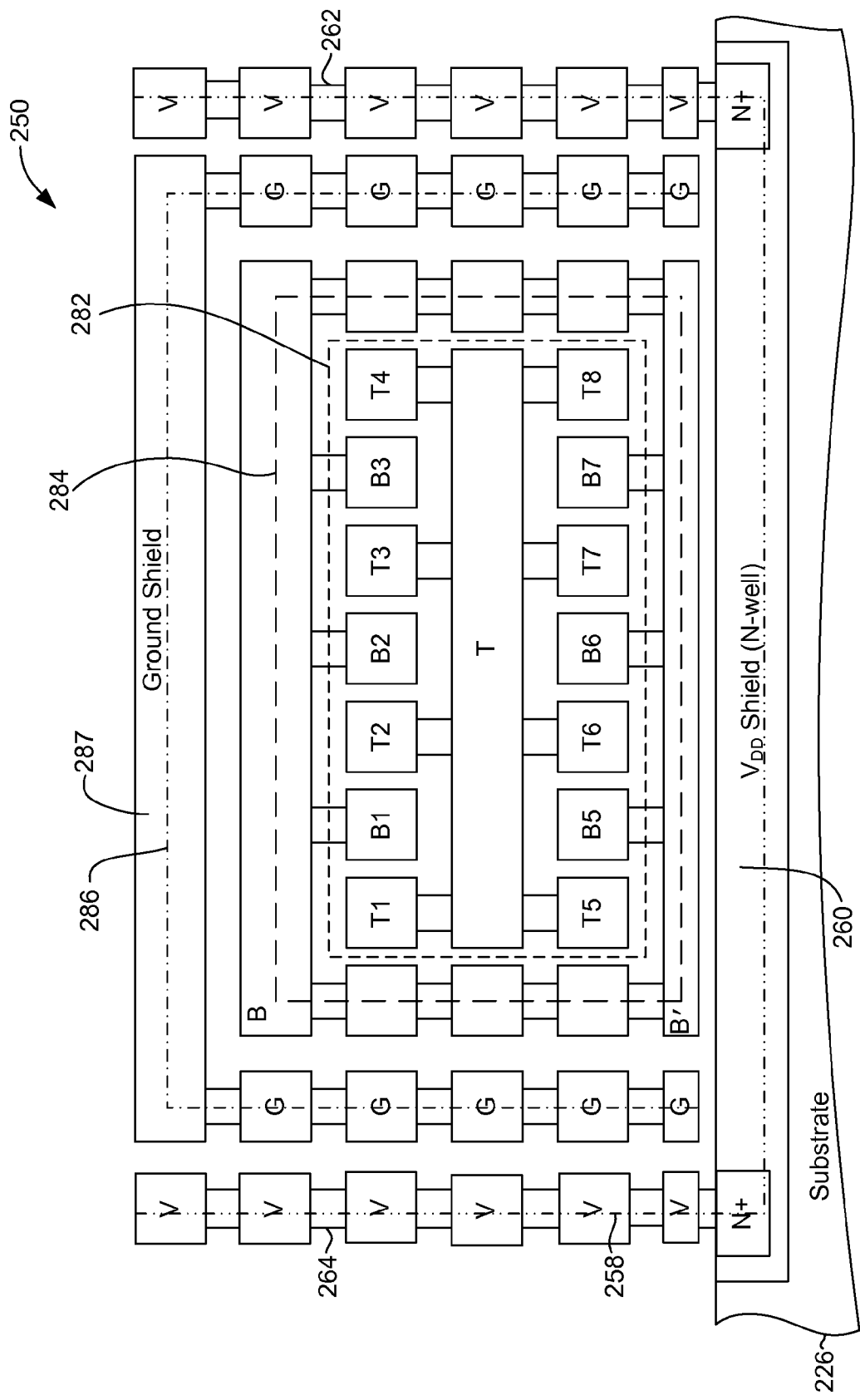
FIG. 2C is a side view of the integrated capacitor according to FIG. 2A with a ground shield according to an embodiment.

FIG. 2C is a side view of the integrated capacitor 250 with a ground shield 286 (represented as a dashed line) according to an embodiment. The integrated capacitor 250 includes a core capacitor portion 282 that includes conductive elements (e.g., filaments) within a metal layer (e.g., M1, M3) alternatively connected to opposite nodes of the capacitor and a shield capacitor portion (bottom node shield) 284. For example, T1, T2, T3, and T4, alternate with B1, B2, and B3 in M3 and T5, T6, T7, and T8 alternate with B5, B6, and B7 in M1. Alternating conductive elements in the core capacitor portion 282 provides significant lateral capacitance, which improves as fabrication dimensions are reduced and the conductive elements become closer together. Similar lateral capacitance is obtained between top node elements T1, T4, T5, T8, and both ends of T and corresponding bottom node elements that form the reference shield. The shield capacitor portion 284 surrounds the core capacitor 282 to form a conductive cage that reduces coupling of the top node to other nodes of the IC.

The integrated capacitor 250 produces good specific capacitance, which is essentially CSIG per unit area of silicon, from both the core capacitor portion 282 and also from coupling between top node elements in the core capacitor portion 282 and the shield capacitor portion 284.

The integrated capacitor includes an optional ground shield 286 that partially surrounds the bottom node shield 284, basically forming a Faraday cup. The ground shield reduces electronic noise generated in the IC that might otherwise couple to the bottom node or top node of the integrated capacitor 250. In a particular embodiment, a ground plate 287 is formed in the M5 layer, providing a low-resistance ground path for connecting the ground shield 286 to one or more ground terminals of the IC. In a particular embodiment, the ground shield 286 is connected to the analog ground of the IC, rather than the digital ground to avoid high switching currents and electrical noise that can be present on the digital ground. High switching currents on a digital ground node of an IC are particularly problematic for FPGAs, where entire blocks of the circuit are often switched on and off.

A $V_{DD}$ shield cup 258 (represented as a dashed line) includes a shield plate 260 formed in an N-well in the semiconductor substrate 226. $V_{DD}$ bias is brought to the N-well $V_{DD}$ shield through conductive curtains 262, 264 or alternatively through conductive pillars. Providing the $V_{DD}$ shield cup 258 further shields the top node and the bottom node of the integrated capacitor from electrical noise. In some ICs, the M5 layer might only be a ground shield with no $V_{DD}$ interconnect allowed at M5.

Figure 2D:
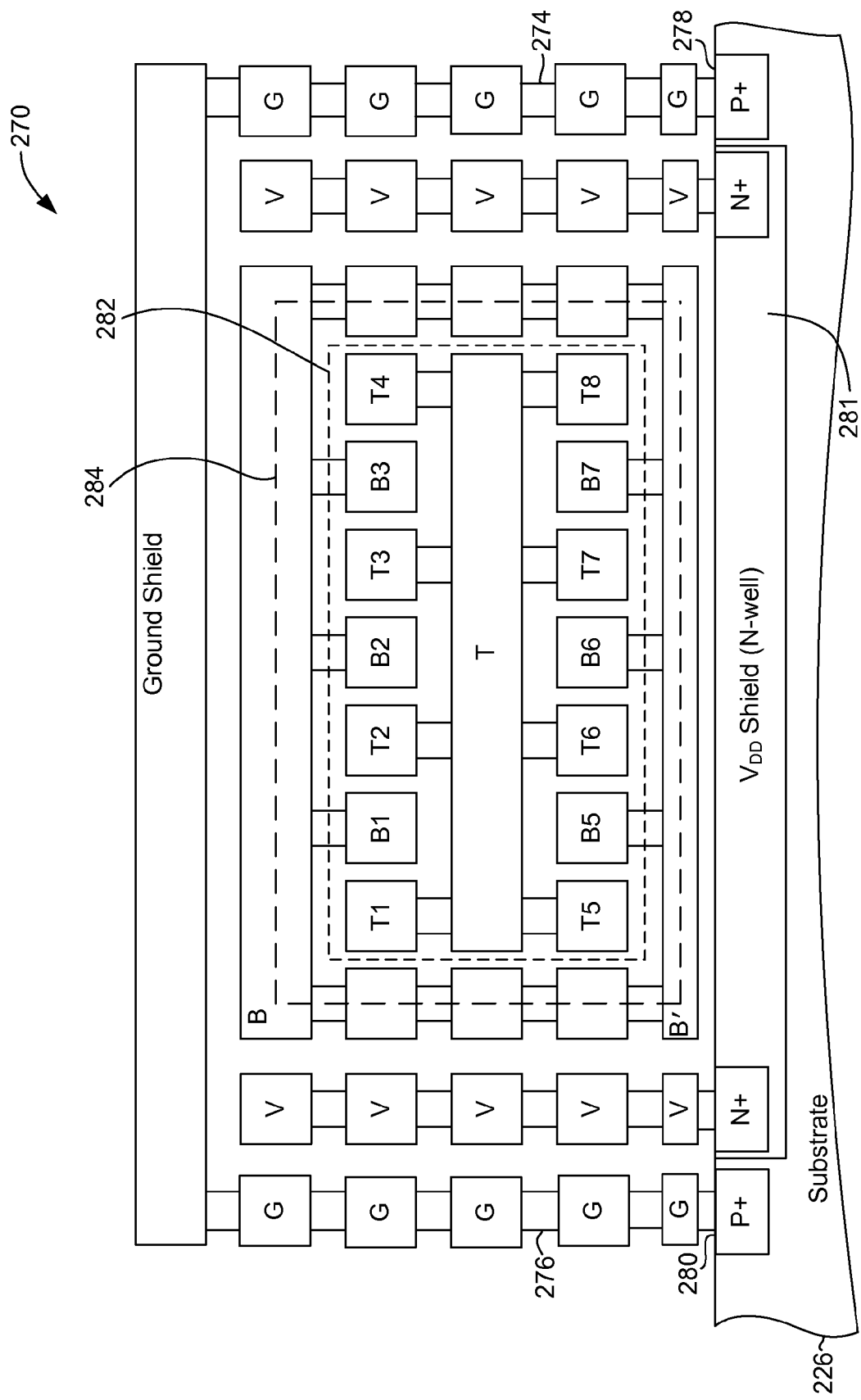
FIG. 2D is a side view of the integrated capacitor according to FIG. 2A with an alternative ground shield according to another embodiment.

FIG. 2D is a view of an integrated capacitor 270 with a ground shield according to another embodiment. The capacitor 270 includes a core capacitor portion 282 and a bottom node shield forming a shield capacitor portion 284 as described above in reference to FIGS. 2A-2C. The shield capacitor portion 284 surrounds the core capacitor portion 282 and isolates the core capacitor portion from electronic noise similarly to how an outer conductive sheath of a cable isolates the inner wires from electronic noise. In a further embodiment, the bottom node shield extends over the ends of the capacitor core not shown in this view (i.e., the ends that are in the plane of the view). In a particular embodiment, the ground shield is connected to analog ground, rather than to digital ground. In a particular embodiment, the portion of the substrate 226 in which the N-well 281 is formed and to which the conductive curtains 274, 276 of the ground shield are connected by P+ regions 278, 280, are optionally formed in a moat (not shown) that isolates the moated portion of the substrate from stray currents in other portions of the substrate. The ground shield and $V_{DD}$ shield forms a shield structure similar to double guard ring shielding, and are particularly desirable to shield the top node of the integrated capacitor in electrically noisy environments. In an alternative embodiment, the $V_{DD}$ shield is omitted.

Figure 3A:
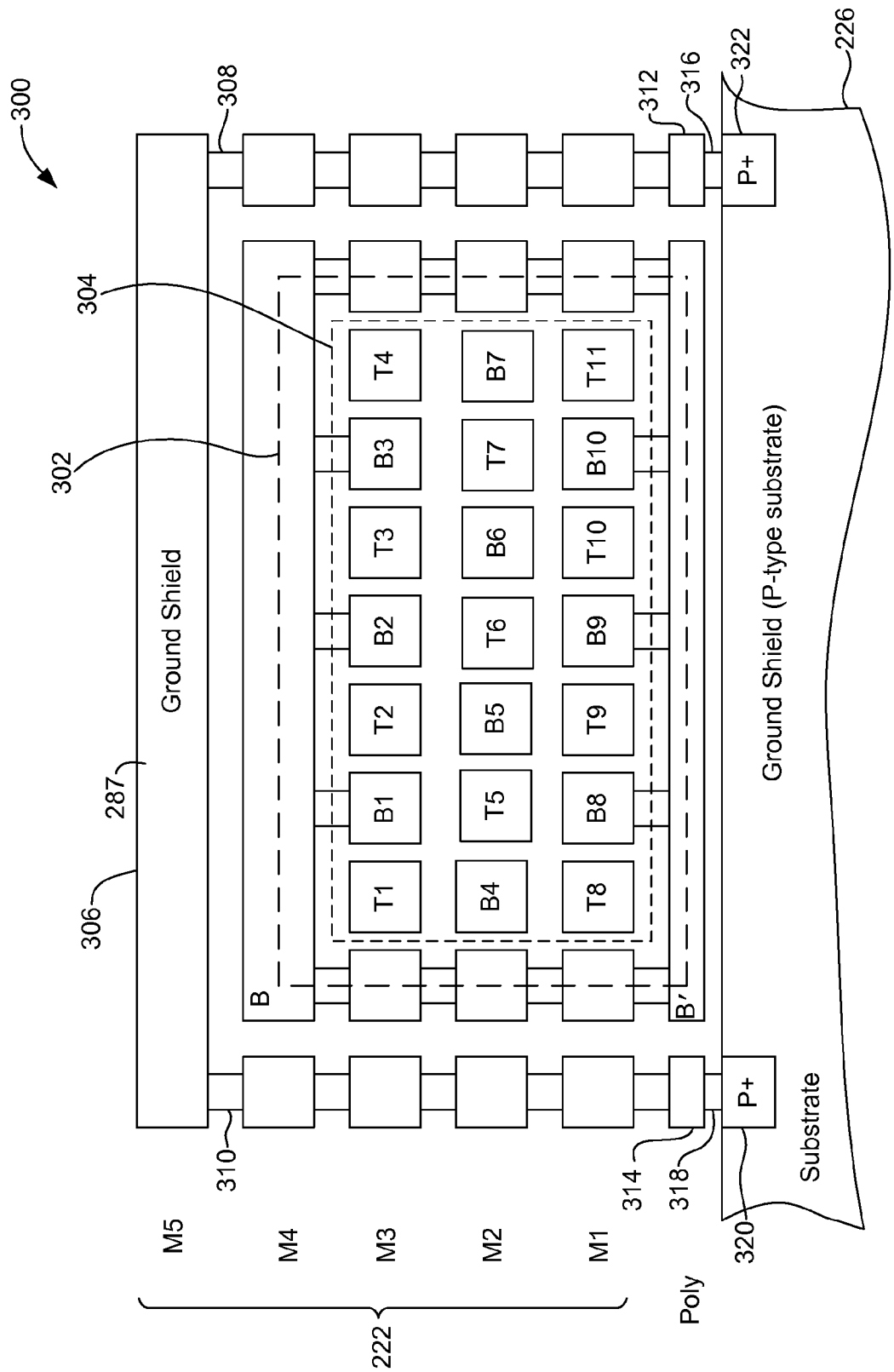
FIG. 3A is a side view of an integrated capacitor with a bottom node shield according to an alternative embodiment.

FIG. 3A is a side view of an integrated capacitor 300 according to an alternative embodiment. A core capacitor portion 304 includes conductive elements (e.g., filaments) within a metal layer (e.g., M1, M2, M3) alternatively connected opposite nodes of the capacitor. For example, T1, T2, T3, and T4 alternate with B1, B2, and B3 in M3, T5, T6, and T7 alternate with B4, B5, B6, and B7 in M2, and T8, T9, T10, T11 alternate with B8, B9, and B10 in M1. Top node elements T1, T4, T8, and T11 also laterally couple with bottom node shield elements.

Alternating conductive elements in the core capacitor portion 304 provides lateral capacitance, which improves as fabrication dimensions are reduced and the conductive elements become closer together. While it would be generally desirable that each end element in a metal layer laterally couple with a conductive filament electrically connected to the opposite node of the integrated capacitor, in an actual device there may be hundreds of parallel conductive filaments in each metal layer, and the few row ends that are not opposite polarity may have relatively little detrimental effect.

A ground shield 306 includes ground shield conductive curtains 308, 310, that essentially surround the core capacitor portion 304 and shield capacitor portion 302 of the integrated capacitor. The ground shield conductive curtains 308, 310, include poly elements 312, 314 and contacts 316, 318 to P+ regions 320, 322 in the substrate 226. In an exemplary application, the ground plate 287 in the M5 layer is connected to an analog ground terminal of the IC. The substrate is relatively high resistance; however, the bottom node plate B' is still well-shielded from coupling to other nodes because the silicon below B' is relatively electrically quiet, particularly if that portion of the substrate is formed in a moat and the ground shield typically makes contact with the substrate around the perimeter of the ground shield.

The ground node plate 287 has relatively low resistance to ground because it is a metal layer. In a particular IC application, the M5 layer is used as a ground shielding layer for an analog portion of the IC, and is composed of wide ground strips (see FIG. 3B) with many ground connection points, rather than occasional thin traces, as in other metal layers. It is particularly desirable in some IC applications to maintain the integrity of the analog ground shield layer; however, embodiments that include a $V_{DD}$ shield plate in the analog ground shield layer are useful in many ICs because the $V_{DD}$ shield is connected to a clean (i.e., relatively electrically quiet) supply, which blocks electrical noise from the analog circuitry below from affecting the remainder of the IC, similar to the effect of the ground plane. The small margin between a $V_{DD}$ shield plate and the ground plane in such embodiments provides relatively little area for unwanted electrical noise emissions to occur.

Figure 3B:
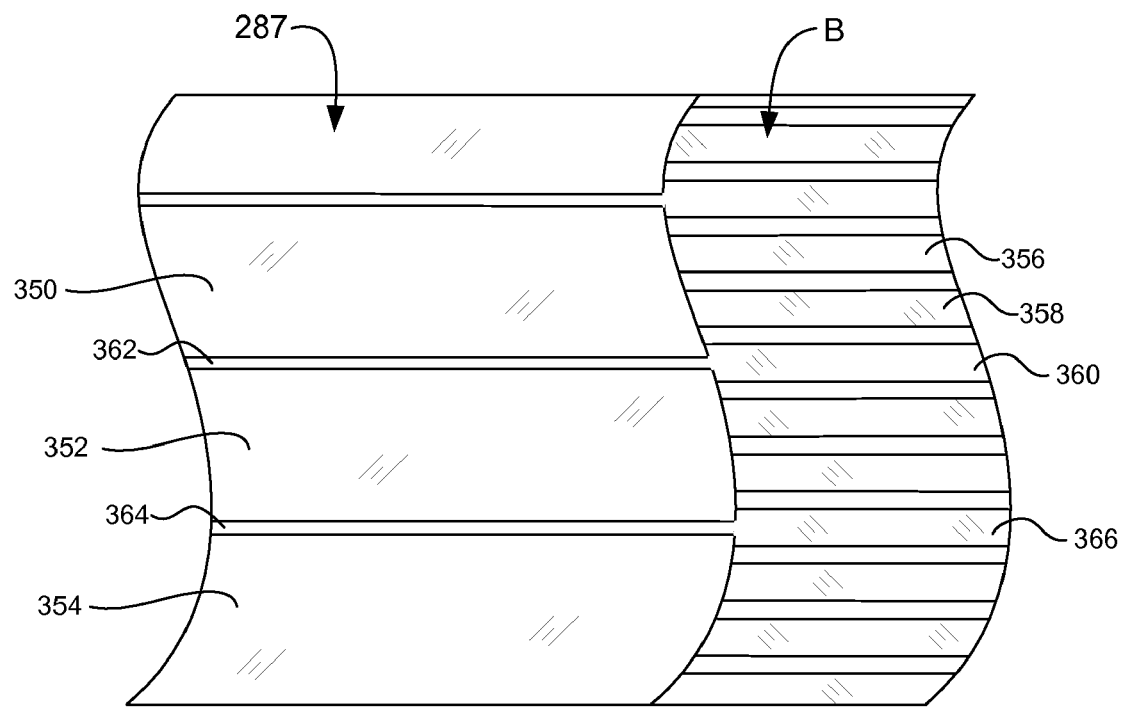
FIG. 3B is a partial cutaway plan view of the M5 and M4 layers showing a portion of the ground plate and underlying bottom node shield plate of FIG. 3A.

FIG. 3B is a partial cutaway plan view of the M5 and M4 layers showing a portion of the ground plate 287 and underlying bottom node shield plate B of FIG. 3A. The ground plate 287 is made up of wide strips 350, 352, 354 that overlie conductive filaments 356, 358, 360, 366 of the upper bottom node shield plate B. The gaps 362, 364 between the ground plate strips 350, 352, 354 are defined over conductive filaments 360, 366 so that a conductor underlies the gap, which improves shielding of the top node of the integrated capacitor; however, this detail is not essential in all embodiments.

Figure 4A:
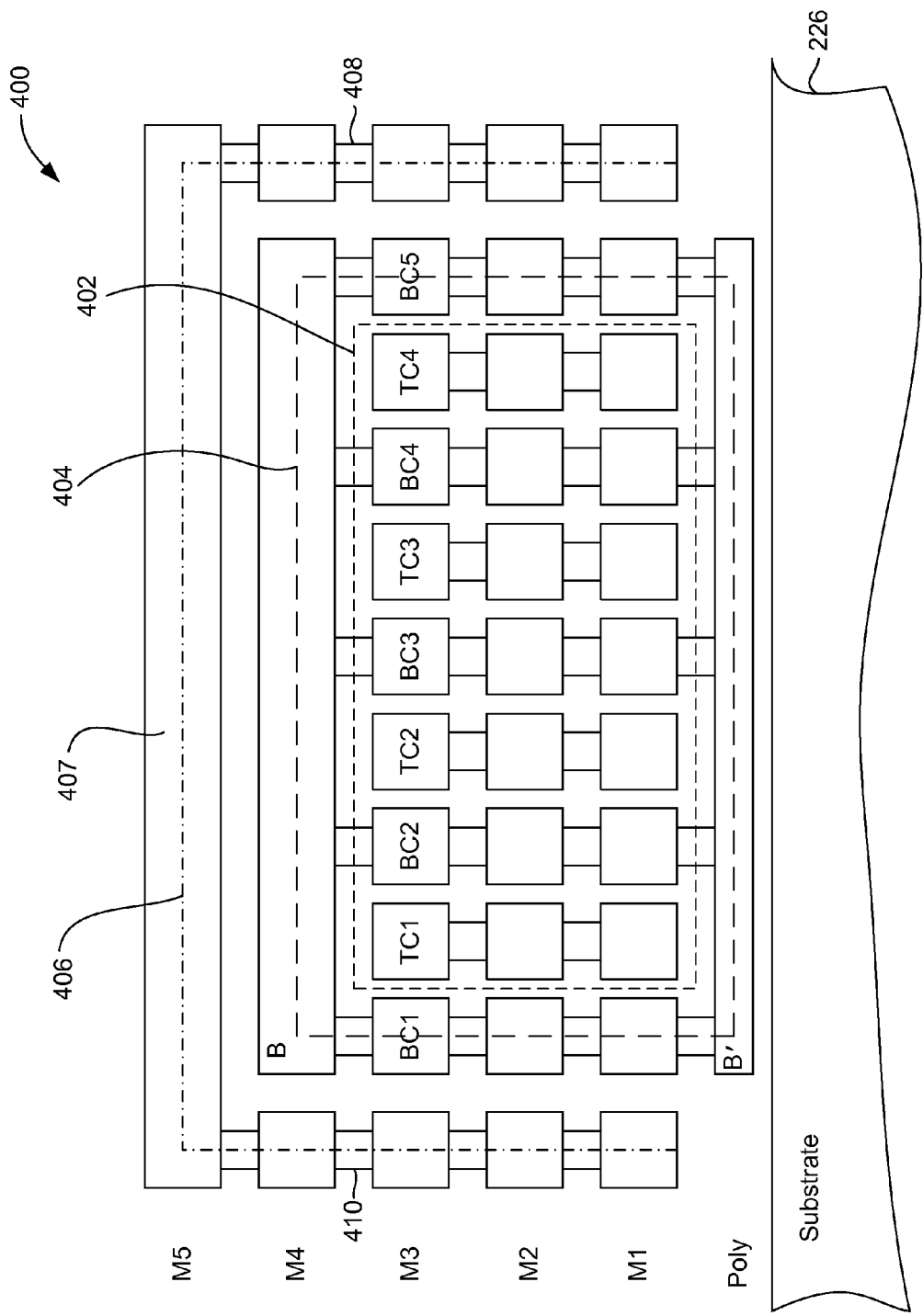
FIG. 4A is side view of an integrated capacitor with a bottom node shield according to yet another alternative embodiment.

FIG. 4A is side view of an integrated capacitor 400 with a bottom node shield capacitor portion 402 according to yet another alternative embodiment. The bottom node shield capacitor portion 402 sheathes a core capacitor portion 404 having a series of conductive curtains TC1, TC2, TC3, TC4 electrically connected to the top node of the integrated capacitor 400, interleaved with a series of conductive curtains BC1, BC2, BC3, BC4, BC5 electrically connected to the bottom node of the integrated capacitor. The conductive curtains are basically conductive filaments formed in successive metal layers connected with conductive vias to form essentially a conductive sheet extending perpendicular to and from the plane of illustration. Electrical connection top node conductive matrix is made through a gap in the bottom node shield, or by bringing a tap (conductive trace) out the end of one of the metal layers. The bottom node conductive curtains BC1, BC2, BC3, BC4, BC5 are electrically connected through the upper bottom node plate B and lower bottom node plate B', but alternatively could be connected through one or the other. The conductive curtains BC1 and BC5 connect the upper bottom node plate B with the lower bottom node plate B', which is formed in the poly layer of the IC, and form part of the shield capacitor portion 404 of the integrated capacitor, as well as providing lateral capacitance to the adjacent top node conductive curtains TC1, TC4 in the core capacitor portion 402. A ground shield cup 406 is formed from a ground shield plate 407 formed in the M5 layer and has conductive curtains 408, 410 extending from the ground shield plate 407 toward the substrate 226. In a further embodiment, the conductive curtains extend through the poly layer to the substrate 226 (see, e.g., FIG. 3A).

Figure 4B:
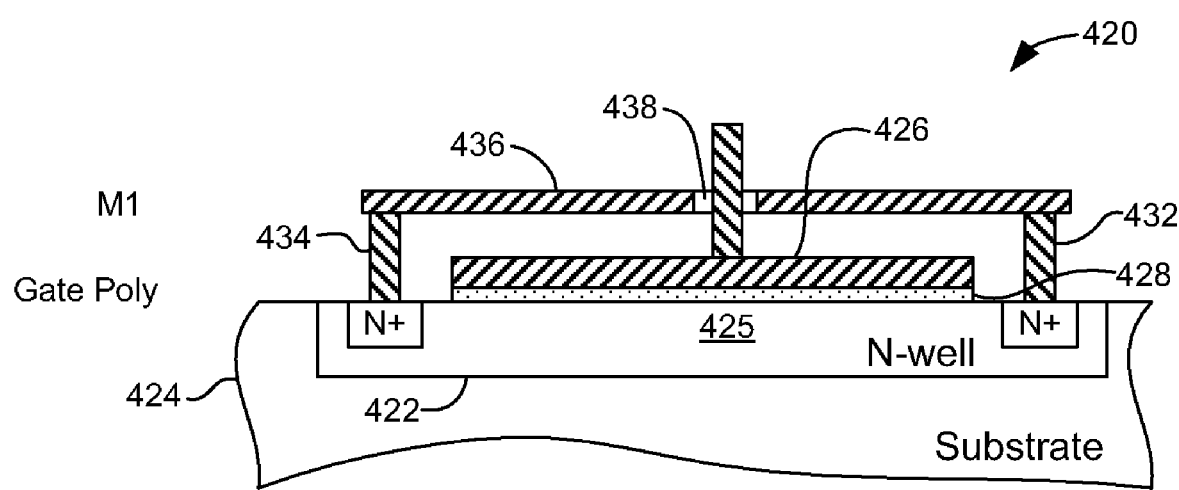
FIG. 4B is a cross section of a shielded integrated thin-dielectric capacitor in an IC according to another embodiment.

FIG. 4B is a cross section of a shielded integrated thin-dielectric capacitor 420 in an IC according to another embodiment. The thin-dielectric capacitor uses a conductive well 422 in the substrate 424 as a first plate 425 of the capacitor ("substrate plate"). A second plate ("gate layer plate") 426 of the thin-dielectric capacitor is formed in a polysilicon, silicide, or metal layer that is commonly the gate layer of the IC. The gate layer plate 426 is separated from the substrate plate 425 by a thin dielectric layer 428 that commonly forms a gate oxide layer or gate dielectric layer of the IC. Some ICs, such as particular FPGAs, have more than one allowable gate dielectric layer thickness, commonly referred to as thin-oxide, mid-oxide, or thick-oxide. While the thinnest gate dielectric layer would provide the highest specific capacitance, thicker gate dielectric, such as mid-oxide or thick oxide, provides superior reliability and yield at a given operating voltage. The maximum operating voltage for a thin-dielectric capacitor is typically less than the maximum gate voltage for an FET having the same dielectric gate layer. Unlike ILD layers and IMD layers (not shown for clarity of illustration), in which a low dielectric material is generally desired, the gate dielectric material preferably has a relatively high dielectric constant to provide good coupling between the gate and channel of MOSFETs in the IC, which enhances the specific capacitance of the thin-dielectric capacitor 420.

A capacitor shield portion is formed around the gate layer plate 426, which in a particular application is the top node of the integrated capacitor 420. Thus, the shield is a bottom node shield capacitor portion. The shield includes the substrate plate 425, contacts 432, 434, and upper bottom node shield plate 436 formed in a metal layer or a second poly layer of the IC. The contacts are generally spaced around the perimeter of the upper plate 436 to form essentially a Faraday cage around the gate layer plate 426. In an alternative embodiment, the upper plate is formed in a second poly layer that is overlain onto the substrate directly, without the use of contacts.

The substrate plate 425 is an element of both the core capacitor portion (i.e., the core capacitor formed by the substrate plate, gate dielectric layer, and gate layer plate) and the shield capacitor portion. The substrate plate is alternatively formed in a P-well or in the native substrate without a well. The upper bottom node shield plate 436 includes a gap 438 through which electrical contact to the top node (gate layer plate 426) is made, while electrical contact to the substrate can be made through the upper bottom node shield plate 436 and contacts 432, 434. Thus, the top node of the integrated capacitor 420 is shielded from electrical noise.

Since the gate layer plate is formed in the poly layer, it can be a contiguous sheet of conductor and does not have to be formed of stripes or filaments, as in superior metal layers. Similarly, the substrate plate can be a contiguous sheet. The upper bottom node shield plate is typically formed from a series of maximum-width metal lines that are interconnected within the layer to approximate a contiguous sheet. The upper bottom node shield plate contributes substantially to the specific capacitance of the integrated capacitor while also shielding the top node from electrical noise. An estimated specific capacitance for a thin-dielectric capacitor according to an embodiment fabricated in an IC using a thick-oxide of about 250 nm thickness is about 7 $fF/\mu m^2$.

Note that the types of and number of layers described are merely examples, and in some embodiments other suitable layers may be used, and any number of layers may be used. For example, the layers used may depend on the types and numbers of layers that are available in the manufacturing process, and other arrangements will be apparent to those of skill in the art. In general, any suitable layer, and an arbitrary number of layers may be used in accordance with embodiments of the present invention.

Figure 5:
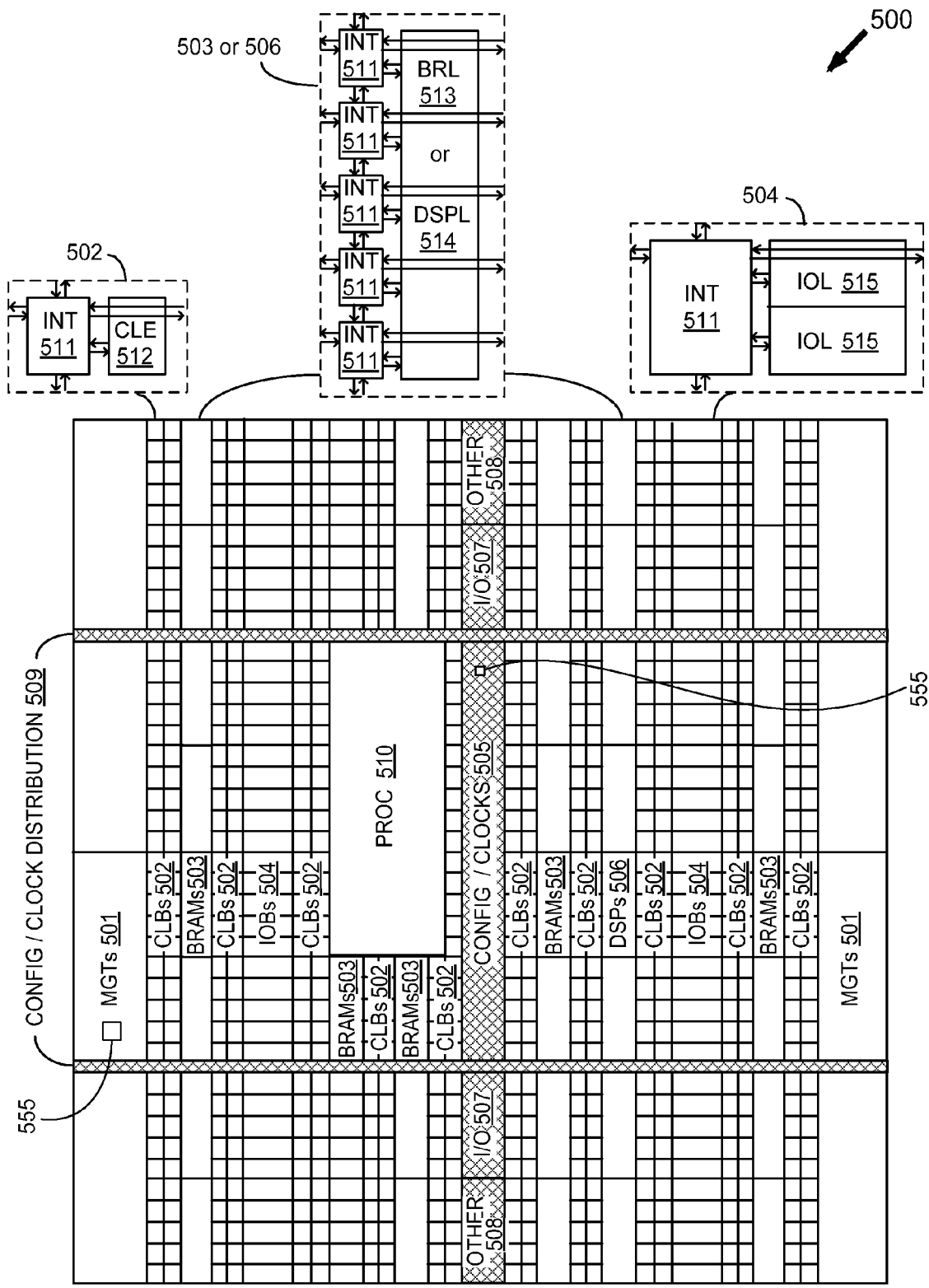
FIG. 5 is a plan view of an FPGA incorporating an integrated capacitor according to an embodiment.

FIG. 5 is a plan view of an FPGA 500 semiconductor device incorporating an integrated capacitor according to an embodiment. The FPGA 500 includes CMOS portions in several of the functional blocks, such as in RAM and logic, and is fabricated using a CMOS fabrication process. One or more integrated capacitors 555 according to one or more embodiments of the invention are incorporated in any of several functional blocks of the FPGA, such as a clock circuit 505, a multi-gigabit transceivers 501, or other functional block; within many functional blocks; or within a physical section or segment of the FPGA 500. Integrated capacitors 555 are particularly desirable in applications where one or both terminals of the capacitor are switched, and embodiments including top plate shielding are further desirable in applications wherein the top plate is connected to or switched to a high-impedance or high-gain node of a circuit in the FPGA 500. Capacitors are generally useful in a wide variety of integrated circuits and in a wide variety of applications. For instance, one or more capacitors may be useful for a switched capacitor network, such as in an analog-to-digital converter, or as a decoupling or filtering capacitor for AC signaling (e.g., in an MGT). In general, the capacitor structure described herein may be useful in any application requiring capacitance.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A capacitor in an integrated circuit ("IC") comprising:
a core capacitor portion having a first plurality of conductive elements electrically connected to and forming a first part of a first node of the capacitor formed in a first conductive layer of the IC and a second plurality of conductive elements electrically connected to and forming a first part of a second node of the capacitor formed in the first conductive layer, the first plurality of conductive elements alternating with the second plurality of conductive elements in the first conductive layer, and a third plurality of conductive elements electrically connected to and forming a second part of the first node formed in a second conductive layer adjacent to the first conductive layer, at least portions of some of the second plurality of conductive elements overlying and vertically coupling to at least portions of some of the third plurality of conductive elements;

a shield capacitor portion having a fourth plurality of conductive elements formed in at least the first conductive layer of the IC, the second conductive layer of the IC, a third conductive layer of the IC, and a fourth conductive layer of the IC, the first conductive layer and the second conductive layer each being between the third conductive layer and the fourth conductive layer, the shield capacitor portion being electrically connected to and forming a second part of the second node of the capacitor and surrounding the first plurality of conductive elements and the third plurality of conductive elements; and a reference shield electrically connected to a reference node of the IC other than the second node of the capacitor, the shield capacitor portion being disposed between the reference shield and the core capacitor portion.

2. The capacitor of claim 1 wherein the third conductive layer is a metal layer of the IC and the fourth conductive layer is a poly layer of the IC, the shield capacitor portion including a first node shield plate formed in the metal layer from a plurality of metal stripes and a second node shield plate formed in the poly layer.

3. The capacitor of claim 1 wherein the shield capacitor portion includes a first node shield plate formed in the third conductive layer and a second node shield plate formed in the fourth conductive layer and further comprising a first conductive curtain extending from the first node shield plate to the second node shield plate and a second conductive curtain extending from the first node shield plate to the second node shield plate.

4. The capacitor of claim 1 wherein the capacitor is a switching capacitor, the first node is a top node of the switching capacitor and the second node is a bottom node of the switching capacitor.

5. The capacitor of claim 1 wherein the reference node is a $V_{DD}$ node.

6. The capacitor of claim 1 wherein the reference node is an analog ground node.

7. The capacitor of claim 1 wherein the first plurality of conductive elements comprises a first plurality of conductive strips extending along a first direction, the second plurality of conductive elements comprises a second plurality of conductive strips extending along the first direction, and the third plurality of conductive elements comprises a third plurality of conductive strips extending along a second direction orthogonal to the first direction.

8. The capacitor of claim 7 wherein each of the conductive elements in the third plurality of conductive elements is adjacent to a conductive element electrically connected to and forming a third part of the first node.

9. The capacitor of claim 8 further comprising a fourth plurality of conductive elements formed in a fifth conductive layer of the IC disposed between the fourth conductive layer and the second conductive layer and electrically connected to and forming a fourth part of the first node, the fourth plurality of conductive elements extending along the first direction, and a fifth plurality of conductive elements electrically connected to and forming a third part of the second node formed in the fifth conductive layer extending along the first direction alternating with the fourth plurality of conductive elements in the fifth conductive layer.

10. The capacitor of claim 1 wherein the first plurality of conductive elements comprises a first plurality of conductive strips extending along a first direction, the second plurality of conductive elements comprises a second plurality of conductive strips extending along the first direction, and the third plurality of conductive elements comprises a third plurality of conductive strips extending along the first direction.

11. The capacitor of claim 10 further comprising a fourth plurality of conductive strips electrically connected to and forming a third part of the second node extending along the first direction and alternating with the third plurality of conductive strips in the second conductive layer.

12. The capacitor of claim 1 further comprising a second reference shield connected to a second reference node of the IC, the reference shield being disposed between the second reference shield and the shield capacitor portion.

13. A capacitor in an integrated circuit ("IC") comprising:
a core capacitor portion having a first plurality of conductive elements electrically connected to and forming a first part of a first node of the capacitor formed in a first conductive layer of the IC and a second plurality of conductive elements electrically connected to and forming a first part of a second node of the capacitor formed in the first conductive layer, the first plurality of conductive elements alternating with the second plurality of conductive elements in the first conductive layer, and a third plurality of conductive elements electrically connected to and forming a second part of the first node formed in a second conductive layer adjacent to the first conductive layer, at least portions of some of the second plurality of conductive elements overlying and vertically coupling to at least portions of some of the third plurality of conductive elements;

a shield capacitor portion having a fourth plurality of conductive elements formed in at least the first conductive layer of the IC, the second conductive layer of the IC, a third conductive layer of the IC, and a fourth conductive layer of the IC, the first conductive layer and the second conductive layer each being between the third conductive layer and the fourth conductive layer, the shield capacitor portion being electrically connected to and forming a second part of the second node of the capacitor and surrounding the first plurality of conductive elements and the third plurality of conductive elements, and a reference shield electrically connected to a reference node of the IC other than the second node of the capacitor, the shield capacitor portion being disposed between the reference shield and the core capacitor portion, wherein the reference shield includes a substrate portion of a substrate of the IC, a first conductive curtain extending from the substrate portion, and a second conductive curtain extending from the substrate portion.

14. The capacitor of claim 13 wherein the substrate portion comprises an N-well of the substrate of the IC.

15. The capacitor of claim 13 wherein the reference shield is a first cup shield having an open top.

16. The capacitor of claim 15 further comprising a second reference shield connected to a second reference node of the IC, the second reference shield including a second reference shield plate extending across the open top of the first cup shield.

17. The capacitor of claim 16 wherein the second reference shield is a second cup shield.

18. A capacitor in an integrated circuit ("IC") comprising:
a first plate formed in a first conductive layer of the IC;
a second plate formed in a substrate of the IC;
a gate dielectric layer disposed between the first plate and the second plate;

a shield plate formed in a second conductive layer of the IC having a perimeter electrically connected the second plate so as to form an electrical shield around the first plate; and a plurality of contacts formed between the shield plate and the second plate;

wherein the shield plate has a gap through which an electrical contact to the first plate extends, and the shield plate, the plurality of contacts, and the second plate provide electrical shielding for the first plate.

19. The capacitor of claim 18 wherein the first conductive layer is a first poly layer, the substrate comprises silicon and second plate is formed in an N-well of the substrate and the shield plate is formed in a second poly layer of the IC.

* * * * *

(12) INTER PARTES REVIEW CERTIFICATE (20th)

United States Patent  (10) Number:  US 7,994,609 K1
Quinn  (45) Certificate Issued:  Jul. 14, 2014

(54) SHIELDING FOR INTEGRATED CAPACITORS

(75) Inventor: Patrick J. Quinn

(73) Assignee: Xilinx, Inc.

Trial Number:

IPR2012-00023 filed Sep. 17, 2012

Petitioner: Intellectual Ventures Management, LLC

Patent Owner: Xilinx, Inc.

Inter Partes Review Certificate for:

Patent No.: 7,994,609
Issued: Aug. 9, 2011
Appl. No.: 12/276,289
Filed: Nov. 21, 2008

The results of IPR2012-00023 are reflected in this inter partes review certificate under 35 U.S.C. 318(b).

INTER PARTES REVIEW CERTIFICATE
U.S. Patent 7,994,609 K1
Trial No. IPR2012-00023
Certificate Issued Jul. 14, 2014

AS A RESULT OF THE INTER PARTES REVIEW PROCEEDING, IT HAS BEEN DETERMINED THAT:

Claims 1-19 are cancelled.

\* \* \* \* \*